United States Patent
Yasui (12) 
(10) Patent No.: US 11,749,499 B2
(45) Date of Patent: Sep. 5, 2023

(54) DATA GENERATION METHOD AND CHARGED PARTICLE BEAM IRRADIATION DEVICE

(71) Applicant: NuFlare Technology, Inc., Yokohama (JP)

(72) Inventor: Kenichi Yasui, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 86 days.

(21) Appl. No.: 17/412,775

(22) Filed: Aug. 26, 2021

(65) Prior Publication Data

US 2022/0093360 A1  Mar. 24, 2022

(30) Foreign Application Priority Data

Sep. 24, 2020  (JP) ................................. 2020-159904

(51) Int. Cl.
*H01J 37/304* (2006.01)

(52) U.S. Cl.
CPC ... *H01J 37/304* (2013.01); *H01J 2237/30416* (2013.01)

(58) Field of Classification Search
CPC ............. H01J 37/304; H01J 2237/30416
See application file for complete search history.

(56) References Cited

U.S. PATENT DOCUMENTS

| 6,774,375 | B2 * | 8/2004 | Plontke | ............... | H01J 37/3174 |
|---|---|---|---|---|---|
|  |  |  |  |  | 250/492.1 |
| 2007/0211061 | A1 | 9/2007 | Kokojima |  |  |
| 2010/0295858 | A1 | 11/2010 | Sugama et al. |  |  |
| 2011/0199381 | A1 | 8/2011 | Tamai |  |  |
| 2014/0071124 | A1 | 3/2014 | Kawahara |  |  |
| 2020/0117095 | A1 * | 4/2020 | Yasui | ................... | G03F 7/7055 |

FOREIGN PATENT DOCUMENTS

| JP | 2007-241878 A | 9/2007 |
|---|---|---|
| JP | 2010-113624 A | 5/2010 |
| JP | 2010-272120 A | 12/2010 |
| JP | 2012-230668 A | 11/2012 |
| JP | 2014-56371 A | 3/2014 |

* cited by examiner

*Primary Examiner* — Sean M Luck
(74) *Attorney, Agent, or Firm* — Oblon, McClelland, Maier & Neustadt, L.L.P.

(57) ABSTRACT

In one embodiment, a data generation method is for calculating a coverage of a polygon in each of a plurality of pixels obtained by dividing a target to be irradiated with a charged particle beam into predetermined sizes. The method includes dividing a parametric curve that defines a pattern shape into a plurality of parametric curves, calculating, for each of the plurality of parametric curves, an area of a region surrounded by a segment connecting end points among control points of the parametric curve and the parametric curve, calculating positions of vertexes of a figure having an area equivalent to the calculated area and having, as one side thereof, the segment connecting the end points, and generating the polygon by using the vertexes.

22 Claims, 10 Drawing Sheets

B-SPLINE CURVE

FIG.6B

BEZIER CURVE

FIG.6C

CONVERSION FORMULA $$P_b = \frac{1}{6} \begin{Bmatrix} 1 & 4 & 1 & 0 \\ 0 & 4 & 2 & 0 \\ 0 & 2 & 4 & 0 \\ 0 & 1 & 4 & 1 \end{Bmatrix} P_s$$

$P_s$ : CONTROL POINT OF B-SPLINE CURVE
$P_b$ : CONTROL POINT OF BEZIER CURVE

FIG.13A FIRST PASS

FIG.13B SECOND PASS

FIG.13C SUPERIMPOSE POLYGONS

FIG.14A THIRD PASS

FIG.14B SUPERIMPOSE POLYGONS

FIG.15A FIRST PASS

FIG.15B SECOND PASS

FIG.16A

FIRST PASS

FIG.16B

SECOND PASS

DATA GENERATION METHOD AND CHARGED PARTICLE BEAM IRRADIATION DEVICE

CROSS REFERENCE TO RELATED APPLICATION

This application is based upon and claims benefit of priority from the Japanese Patent Application No. 2020-159904, filed on Sep. 24, 2020, the entire contents of which are incorporated herein by reference.

FIELD

The present invention relates to a data generation method and a charged particle beam irradiation device.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern formed on a quartz is employed. The highly precise original image pattern is written by using an electron beam writing apparatus, in which a technology commonly known as electron beam lithography is used.

A known example of the electron beam writing device is a multi-beam writing device that achieves an improved throughput by radiating a lot of beams at one time by using multi-beams. In this multi-beam writing device, for example, an electron beam emitted from an electron gun passes an aperture member having a plurality of openings. This forms multi-beams, and blanking of each beam is controlled by a blanking plate. A beam that is not blocked is reduced by an optical system and reaches a desired position on a mask on which a pattern is to be written.

In electron beam writing using a multi-beam writing device, an irradiation amount of each beam is controlled by calculating a coverage of an input figure for each of pixels that are sections of a predetermined size obtained by division. Furthermore, also in a case where an irradiation amount is calculated by using sections (second sections) larger than the pixels for deciding an irradiation amount of each beam, it is necessary to calculate a coverage in each of the second sections. In a case where the input figure includes a curve, a coverage can be calculated relatively easily by approximation to a polygon. However, high-precision approximation increases the number of vertexes of an approximate polygon, thereby undesirably taking a long time for data processing.

DETAILED DESCRIPTION

In one embodiment, a data generation method is for calculating a coverage of a polygon in each of a plurality of pixels obtained by dividing a target to be irradiated with a charged particle beam into predetermined sizes. The method includes dividing a parametric curve that defines a pattern shape into a plurality of parametric curves, calculating, for each of the plurality of parametric curves, an area of a region surrounded by a segment connecting end points among control points of the parametric curve and the parametric curve, calculating positions of vertexes of a figure having an area equivalent to the calculated area and having, as one side thereof, the segment connecting the end points, and generating the polygon by using the vertexes.

An embodiment of the present invention will be described below with reference to the drawings. In the embodiment, a configuration using an electron beam as an example of a charged particle beam will be described. The charged particle beam is not limited to the electron beam. For example, the charged particle beam may be an ion beam.

First Embodiment

Figure 1:
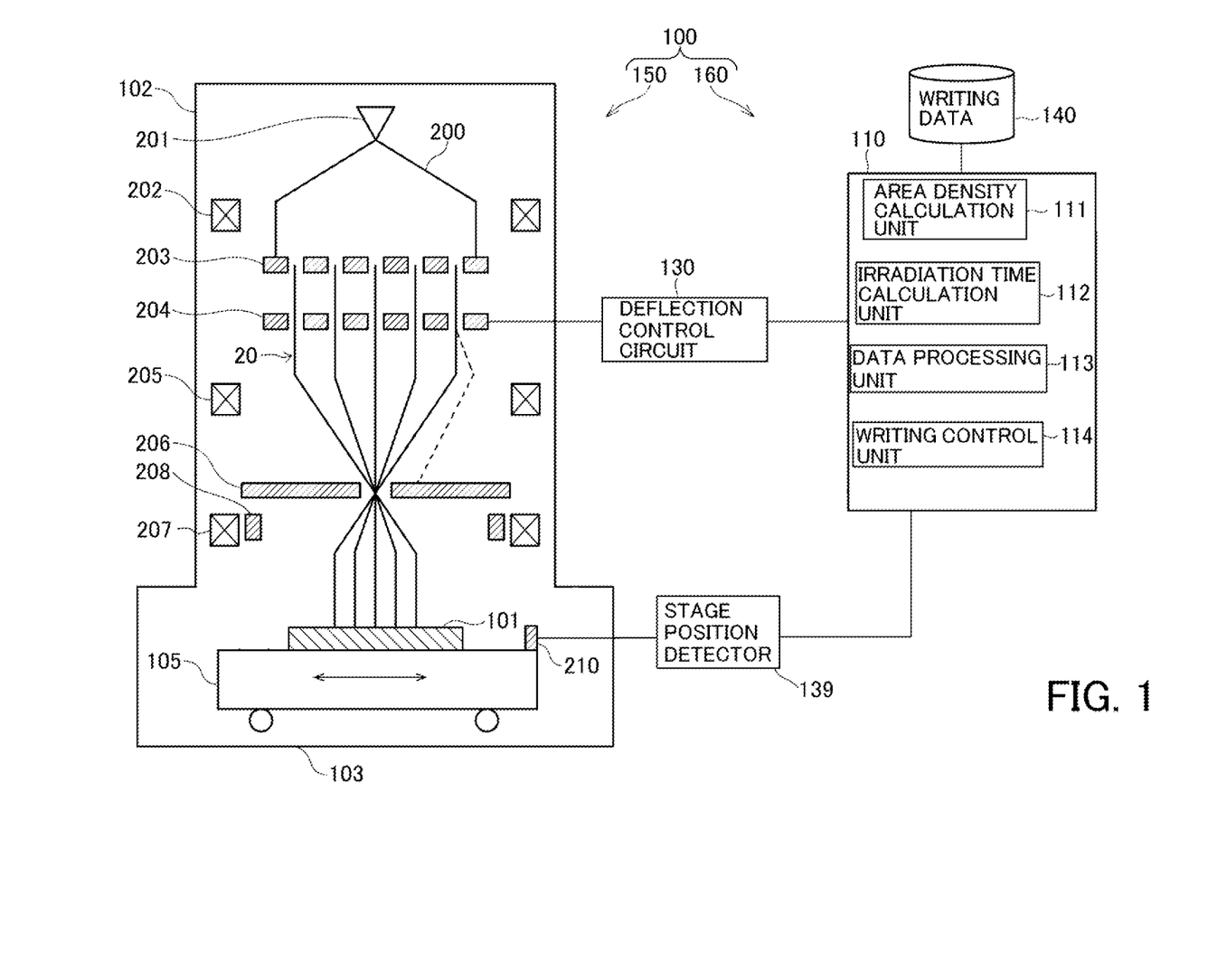
FIG. 1 is a schematic view of a multi charged particle beam writing device according to an embodiment of the present invention.

FIG. 1 illustrates an outline configuration of a writing device 100 according to the first embodiment. As illustrated in FIG. 1, the writing device 100 includes a writing unit 150 and a control unit 160. The writing device 100 is an example of a multi charged particle beam writing device. The writing unit 150 includes an electron lens barrel 102 and a writing chamber 103. In the electron lens barrel 102, an electron gun 201, a lighting lens 202, a shaping aperture array plate 203, a blanking aperture array plate 204, a reducing lens 205, a limiting aperture member 206, an objective lens 207, and a deflector 208 are disposed.

In the writing chamber 103, an XY stage 105 is disposed. A substrate 101 on which a pattern is to be written is disposed on the XY stage 105. The substrate 101 is, for example, mask blanks or a semiconductor substrate (silicon wafer). Furthermore, a mirror 210 for position measurement is disposed on the XY stage 105.

The control unit 160 has a control calculator 110, a deflection control circuit 130, a stage position detector 139, and a storage unit 140. The storage unit 140 stores therein writing data supplied from an outside. In the writing data, information on a plurality of figure patterns describing patterns to be formed on the substrate 101 is defined. The figure patterns include a curve, and a shape thereof is defined, for example, by a cubic B-spline curve.

The control calculator 110 has an area density calculation unit 111, an irradiation time calculation unit 112, a data processing unit 113, and a writing control unit 114. Each unit of the control calculator 110 may be realized by hardware such as an electric circuit or may be realized by software such as programs that execute these functions. Alternatively, each unit of the control calculator 110 may be realized by a combination of hardware and software.

The stage position detector 139 irradiates the mirror 210 with a laser, receives reflected light, and detects a position of the XY stage 105 by using the principle of laser interferometry.

Figure 2:
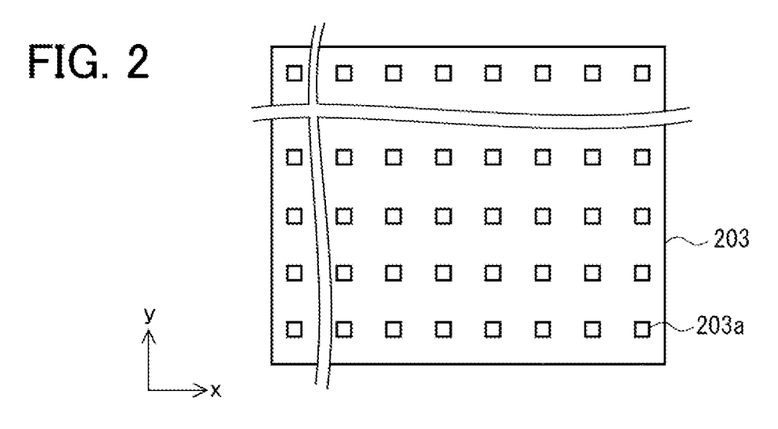
FIG. 2 is a plan view of a shaping aperture array plate.

FIG. 2 is a conceptual diagram illustrating a configuration of the shaping aperture array plate 203. As illustrated in FIG. 2, the shaping aperture array plate 203 has a plurality of openings 203a formed at predetermined intervals along a lengthwise direction (y direction) and a lateral direction (x direction). The openings 203a are preferably rectangles or circles having the same dimension and shape. A part of an electron beam 200 passes each of the plurality of openings 203a, and thus multi-beams 20 are formed.

The blanking aperture array plate 204 has passage holes at positions corresponding to the openings 203a of the shaping aperture array plate 203. A blanker made up of a pair of electrodes is disposed in each passage hole. Of the two electrodes of the blanker, for example, one electrode is grounded and kept at a ground potential, and the other electrode is switched to a ground potential or a potential other than the ground potential. This switches OFF/ON of deflection of a beam passing a passage hole, thereby controlling blanking. In a case where the blanker does not deflect a beam, the beam is ON. In a case where the blanker deflects a beam, the beam is OFF. In this way, the plurality of blankers perform blanking deflection of corresponding beams of multi-beams that have passed the plurality of openings 203a of the shaping aperture array plate 203.

The electron beam 200 emitted from the electron gun 201 (emitting unit) illuminates the whole shaping aperture array plate 203 due to the lighting lens 202. The electron beam 200 illuminates a region including all of the openings 203a. The electron beam 200 passes the plurality of openings 203a of the shaping aperture array plate 203, and thus a plurality of electron beams (multi beams) 20 having, for example, a rectangular shape is formed.

The multi-beams 20 pass corresponding blankers of the blanking aperture array plate 204. Each of the blankers performs blanking deflection of a beam that is switched off among electron beams that individually pass the blankers. Each of the blankers does not perform blanking deflection of a beam that is switched on. The multi-beams 20 that have passed the blanking aperture array plate 204 are reduced by the reducing lens 205 and travel toward a central opening of the limiting aperture member 206.

A beam that is controlled to a beam off state is deflected by the blanker and travels along a path passing an outside of the opening of the limiting aperture member 206 and is therefore blocked by the limiting aperture member 206. Meanwhile, a beam that is controlled to a beam on state is not deflected by the blanker and therefore passes the opening of the limiting aperture member 206. In this way, blanking control is performed by ON/OFF of deflection of the blanker, and thus ON/OFF of a beam is controlled. The blanking aperture array plate 204 functions as an irradiation time control unit that controls an irradiation time of each beam of multi-beams.

The limiting aperture member 206 allows beams deflected to a beam ON state by the blankers of the blanking aperture array plate 204 to pass therethrough and blocks beams deflected to a beam OFF state by the blankers of the blanking aperture array plate 204. One shot of multi-beams is formed by beams formed from beam ON to beam OFF and having passed the limiting aperture member 206.

The multi-beams that have passed the limiting aperture member 206 are focused by the objective lens 207 and form a pattern image of a desired reduction rate on the substrate 101. The beams (whole multi-beams) that have passed the limiting aperture member 206 are collectively deflected by the deflector 208 in the same direction and reach a desired position on the substrate 101.

In a case where the XY stage 105 is continuously moving, a beam irradiation position is controlled by the deflector 208 so as to follow movement of the XY stage 105 at least while the substrate 101 is irradiated with the beams. The multi-beams that are radiated one time are ideally arranged at intervals obtained by multiplying the intervals at which the plurality of openings 203a of the shaping aperture array plate 203 are arranged by the desired reduction rate.

Figure 3:
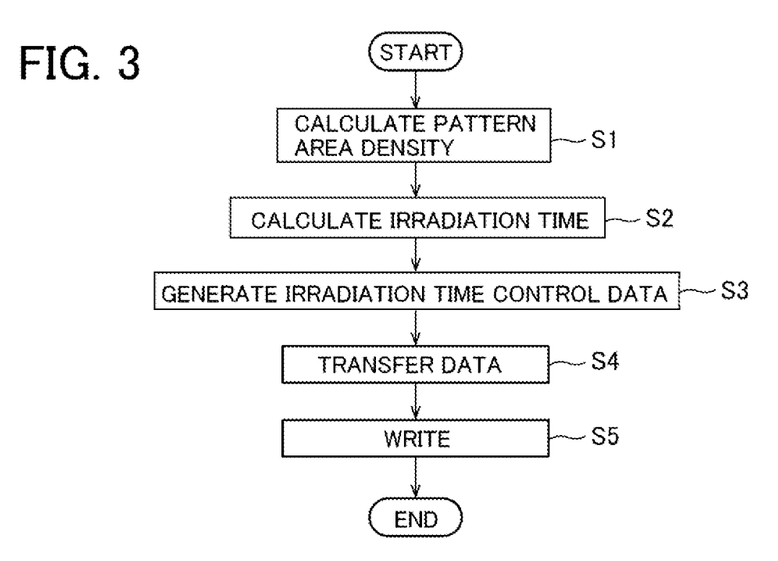
FIG. 3 is a flowchart for explaining a writing method.

Next, a pattern writing method according to the present embodiment is described with reference to the flowchart illustrated in FIG. 3. In a pattern area density calculation step (step S1), the area density calculation unit 111 virtually divides a writing region of the substrate 101 into a plurality of mesh regions. A size of each of the mesh regions is, for example, equivalent to a size of a single beam, and each of the mesh regions becomes a pixel (unit irradiation region). The area density calculation unit 111 reads out writing data from the storage unit 140, calculates a pattern area density (coverage) p of each pixel by using a pattern defined in the writing data, and generates a pixel map that defines a coverage of each pixel. A method for generating the pixel map will be described later.

In an irradiation time calculation step (step S2), the irradiation time calculation unit 112 calculates an irradiation amount $\rho D_0$ of a beam with which each pixel is irradiated by multiplying the pattern area density $\rho$ with a reference irradiation amount $D_0$. The irradiation time calculation unit 112 may further multiply a correction coefficient for correcting a proximity effect or the like. The irradiation time calculation unit 112 calculates an irradiation time of each of the plurality of beams that constitute the multi-beams by dividing the irradiation amount by a current amount of the beam.

In an irradiation time control data generation step (step S3), the data processing unit 113 generates irradiation time control data by rearranging the irradiation time data in a shot order according to a writing sequence.

In a data transfer step (step S4), the writing control unit 114 supplies the irradiation time control data to the deflection control circuit 130. The deflection control circuit 130 supplies the irradiation time control data to each blanker of the blanking aperture array plate 204.

In a writing step (step S5), the writing control unit 114 controls the writing unit 150 to perform writing processing on the substrate 101. Each blanker of the blanking aperture array plate 204 gives a desired exposure amount to each pixel by switching ON/OFF of a beam on the basis of the irradiation time control data.

Figure 4:
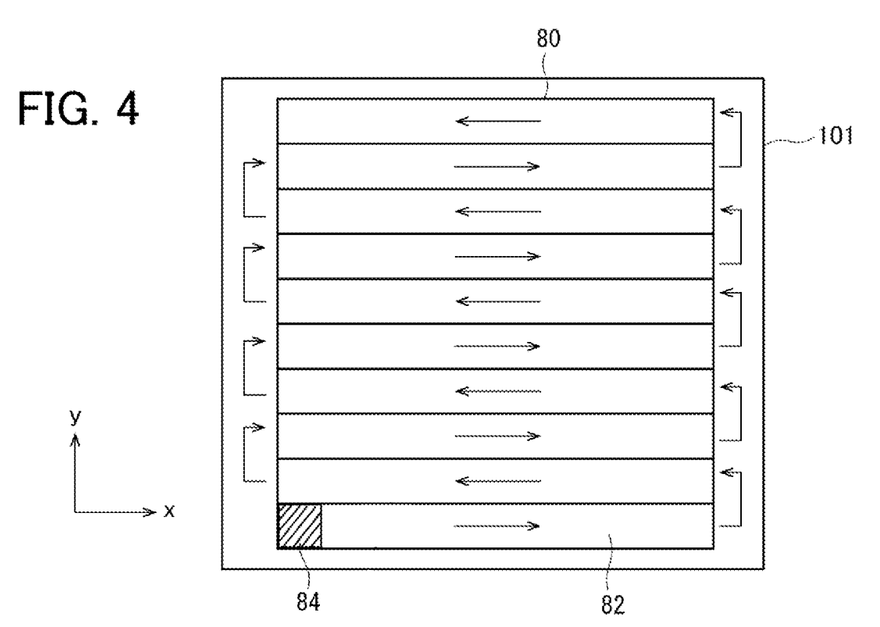
FIG. 4 is a view for explaining writing operation.

FIG. 4 is a conceptual diagram for explaining writing operation. As illustrated in FIG. 4, the writing region 80 of the substrate 101 is, for example, virtually divided into a plurality of stripe regions 82 having a strip shape of a predetermined width in a y direction (first direction). First, the XY stage 105 is moved so that an irradiation region (beam array) 84 that can be irradiated by one irradiation of multi-beams is located at a left end of the first stripe region 82, and then writing starts.

When the first stripe region 82 is written, writing is performed in a +x direction relatively by moving the XY stage 105 in a −x direction. The XY stage 105 is continuously moved at a predetermined speed. After end of the writing of the first stripe region 82, the stage position is moved in the −y direction so that the beam array 84 is located at a right end of the second stripe region 82. Next, writing is performed in the −x direction by moving the XY stage 105 in the +x direction.

In the third stripe region 82, writing is performed in the +x direction, and in the fourth stripe region 82, writing is performed in the −x direction. A writing time can be shortened by performing writing while alternately changing a direction. Alternatively, the stripe regions 82 may be always written in the same direction, that is, either the +x direction or the −x direction.

Next, a method for generating a pixel map by the area density calculation unit 111 is described with reference to the flowchart illustrated in FIG. 5.

The area density calculation unit 111 reads out writing data from the storage unit 140 and converts a curve of a figure pattern defined by a cubic B-spline curve into a cubic (third-order) Bezier curve (step S101). For example, the cubic B-spline curve illustrated in FIG. 6A is converted into a cubic Bezier curve illustrated in FIG. 6B. FIG. 6C illustrates an example of a conversion formula.

Figure 6A:
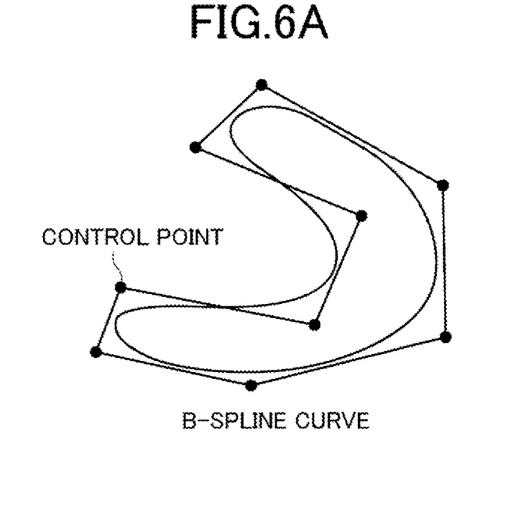
FIG. 6A illustrates an example of a B-spline curve.
Figure 6B:
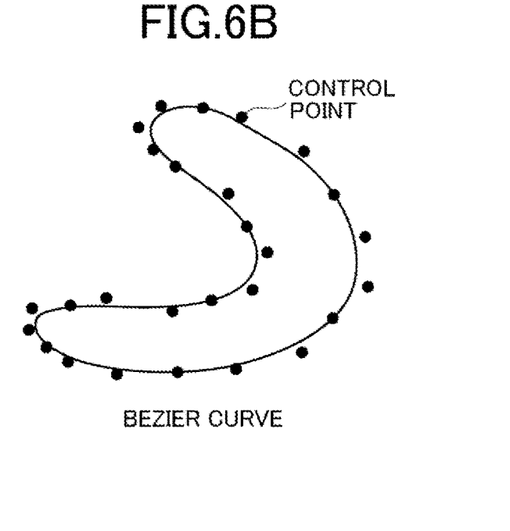
FIG. 6B illustrates an example of a Bezier curve.
Figure 7A:
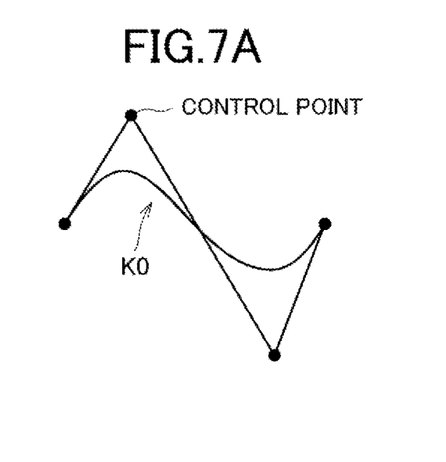
FIG. 7A illustrates an example of a Bezier curve.

A cubic Bezier curve is expressed by four control points, as illustrated in FIG. 7A. That is, in the example illustrated in FIG. 6B, consecutive combinations of four control points surround a figure. Among the four control points, two control points (end points), specifically, a start point and a termination point are located on a curve.

The area density calculation unit 111 divides a Bezier curve expressed by four control points into smaller Bezier curves at a position of an inflection point (step S102). The inflection point is a point at which curvature=$(dPx/dt)(dPy^2/dt^2)-(dPy/dt)(dPx^2/dt^2)=0$.

Figure 7B:
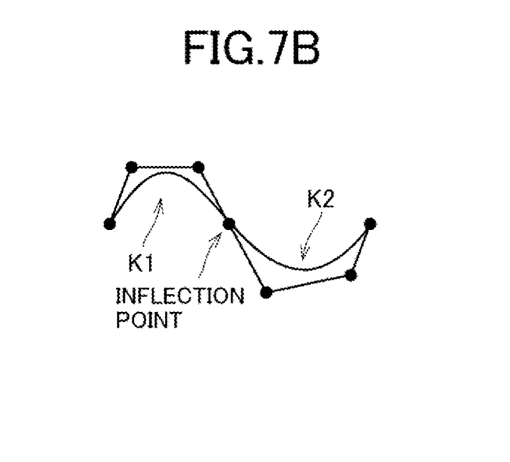
FIG. 7B illustrates an example of division of the Bezier curve.

For example, a Bezier curve K0 illustrated in FIG. 7A includes a single inflection point and is therefore divided into two Bezier curves K1 and K2 as illustrated in FIG. 7B. Bezier curves obtained after division at an inflection point do not cross straight lines connecting four control points in order.

Figure 8A:
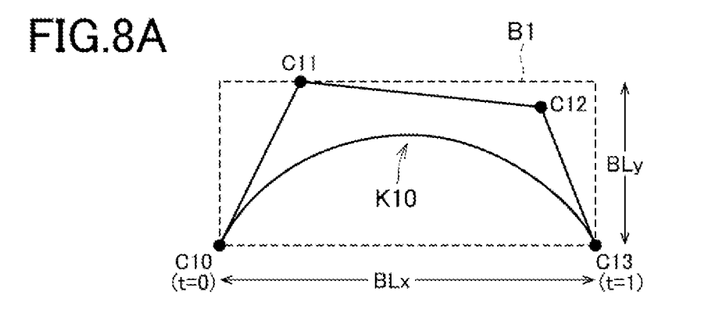
FIG. 8A illustrates an example of a Bezier curve.

Next, an index for determining whether or not control points (direction points) are sufficiently proximal to a Bezier curve is calculated (step S103). For example, assume that a Bezier curve K10 is defined by four control points C10, C11, C12, and C13, as illustrated in FIG. 8A.

The area density calculation unit 111 calculates a size of a bounding box B1 that surrounds a quadrangle whose vertexes are the controls points C10, C11, C12, and C13 as an index indicative of a degree of proximity of the control points to the Bezier curve. The size of the bounding box B1 may be an area of the bounding box B1 or may be a width BLx and/or a height BLy of the bounding box B1.

In a case where the calculated index is larger than a predetermined threshold value (Yes in step S104), the area density calculation unit 111 determines that the control points (the direction points C11 and C12) are away from the Bezier curve and redivides the Bezier curve into smaller Bezier curves (step S105).

Figure 8B:
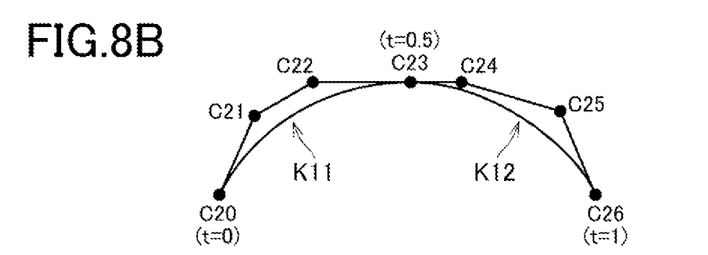
FIG. 8B illustrates an example of division of the Bezier curve.

For example, as illustrated in FIG. 8B, the Bezier curve K10 (first parametric curve) is redivided at an intermediate point (t=0.5) into a Bezier curve K11 and a Bezier curve K12, and control points that define the Bezier curves K11 and K12 (second parametric curves) are found.

The Bezier curve K11 is defined by control points C20, C21, C22, and C23. The Bezier curve K12 is defined by control points C23, C24, C25, and C26. The control points C20 and C26 are identical to the control points C10 and C13 of FIG. 8A. The control point C23 is an intermediate point at which the Bezier curve K10 was redivided.

Figure 8C:
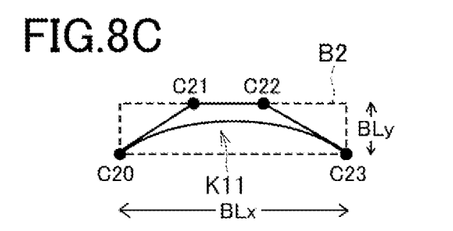
FIGS. 8C and 8D illustrate an example of a Bezier curve obtained by the division.
Figure 8D:
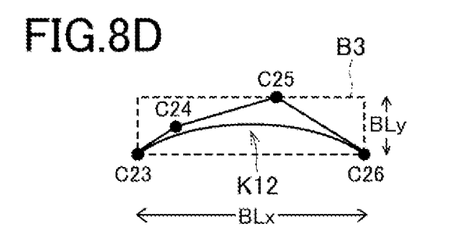

As illustrated in FIGS. 8C and 8D, the area density calculation unit 111 calculates, for each of the Bezier curves K11 and K12, an index for determining whether or not the control points are sufficiently proximal to the Bezier curve (step S103). For example, the area density calculation unit 111 calculates a width BLx and/or a height BLy of a bounding box B2 that surrounds a quadrangle whose vertexes are the control points C20, C21, C22, and C23. Furthermore, the area density calculation unit 111 calculates a width BLx and/or a height BLy of a bounding box B2 that surrounds a quadrangle whose vertexes are the control points C23, C24, C25, and C26.

For all Bezier curves, redivision of the Bezier curve and calculation of an index are repeated until the index becomes equal to or smaller than a predetermined threshold value (steps S103 to S105). In a case where a width and/or a height are used as the index, it is desirable that a value of the threshold value is about a size of a section for which a coverage is to be found.

When the index becomes equal to or smaller than the predetermined threshold value for all Bezier curves (No in step S104), the area density calculation unit 111 calculates an area Ac of a curve portion of the Bezier curve (step S106). In the case of a Bezier curve K defined by control points C0, C1, C2, and C3 illustrated in FIG. 9, the area Ac of the curve portion is an area of a region (the shaded portion in FIG. 9) surrounded by a segment connecting the control point (end points) C0 and C3 and a Bezier curve between the control points C0 and C3 can be calculated by a formula of the Bezier curve and a line integral using the Green's theorem.

Figure 9:
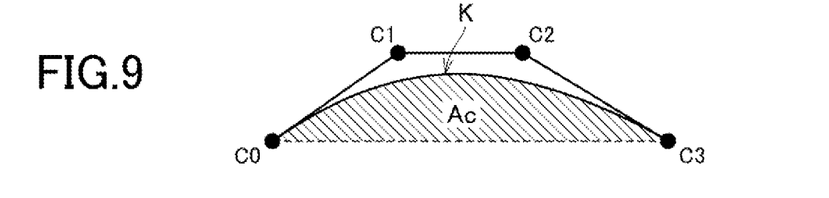
FIG. 9 is a view for explaining an area of a curved portion of a Bezier curve.

The area density calculation unit 111 generates a figure whose bottom side is the segment connecting the control points C0 and C3 and whose area is equivalent to Ac calculated in step S106 (step S107). The generated figure is a trapezoid or a triangle. A case where areas are equivalent encompasses not only a case where the areas are identical, but also a case where a difference (error) between the areas falls within a predetermined range. It is preferable to generate a figure whose area is identical to Ac. In the embodiment below, a method for finding a trapezoid or a triangle having the area Ac is described.

Figure 10:
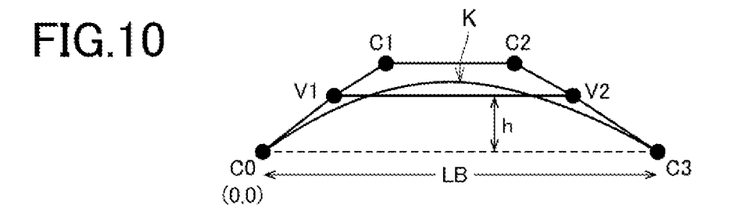
FIG. 10 illustrates an example of a trapezoid having the same area as the curve portion.

For example, as illustrated in FIG. 10, a trapezoid whose bottom side (lower base) is the segment connecting the control points C0 and C3 is generated. The trapezoid has the control points C0 and C3 and vertexes V1 and V2 as vertexes thereof. The vertex V1 is located on a segment connecting the control point C0 and the control point C1. The vertex V2 is located on a segment connecting the control point C2 and the control point C3. The area density calculation unit 111 calculates coordinates (P1x, P1y) of the vertex V1 and coordinates (P2x, P2y) of the vertex V2 assuming that coordinates of the control point C0 are an origin (0, 0).

The following formula 1 is established where h is a height of this trapezoid, LB is a length of the lower base, α is an inclination of a straight line connecting the control point C0 and the control point C1, and β is an inclination of a straight line connecting the control point C2 and the control point C3.

$$a \cdot h^2 + b \cdot h + c = 0$$

$$a = (1/\beta - 1/\alpha) \times 0.5$$

$$b = 2 \times LB$$

$$c = Ac \qquad \text{(Formula 1)}$$

The height h of the trapezoid is found from the above formula 1. The coordinates (P1x, P1y) of the vertex V1 and coordinates (P2x, P2y) of the vertex V2 are as follows.

$$P1x = h/\alpha$$

$$P1y = h$$

$$P2x = LB + h/\beta$$

$$P2y = h$$

In this way, the trapezoid having the control points C0 and C3 and the vertexes V1 and V2 as vertexes thereof and having the area Ac is generated.

Figure 11:
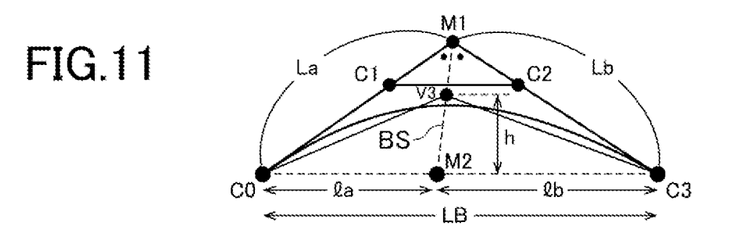
FIG. 11 illustrates an example of a triangle having the same area as the curve portion.

Furthermore, for example, as illustrated in FIG. 11, a triangle whose bottom side is the segment connecting the control points C0 and C3 and having the area Ac is generated. This triangle has the control points C0 and C3 and the vertex V3 as vertexes thereof. The vertex V3 is located on a bisector BS of an angle formed between a straight line connecting the control point C0 and the control point C1 and a straight line connecting the control point C2 and the control point C3. An intersection of the straight line connecting the control point C0 and the control point C1 and the straight line connecting the control point C2 and the control point C3 is referred to as M1. An intersection of the bisector BS and the bottom side of the triangle is referred to as M2.

Coordinates (P3x, P3y) of the vertex V3 are found from the following formula 2 where h is a height of this triangle, LB is a length of the bottom side, La is a length from the control point C0 to the intersection M1, Lb is a length from the control point C3 to the intersection M1, la is a length from the control point C0 to the intersection M2, lb is a length from the control point C3 to the intersection M2, α is an inclination of the bisector BS, and (Mx, My) is coordinates of the intersection M1.

$$P3x = la + (h/\alpha)$$

$$P3y = h = 2 \times Ac/LB$$

$$la = La \times LB/(La + Lb)$$

$$\alpha = My(Mx - la) \qquad \text{(Formula 2)}$$

Figure 12:
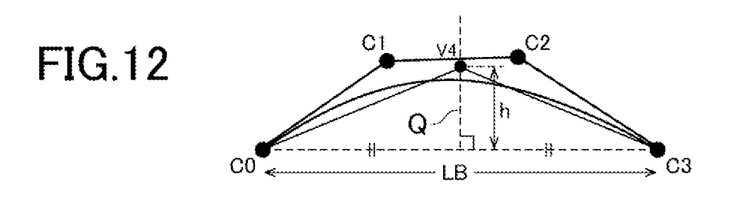
FIG. 12 illustrates an example of a triangle having the same area as the curve portion.

The triangle whose bottom side is the segment connecting the control points C0 and C3 and having the area Ac may be a triangle whose vertex V4 is located on a perpendicular bisector Q of the segment connecting the control points C0 and C3, as illustrated in FIG. 12. In this case, coordinates (P4x, P4y) of the vertex V4 are found from the following formula 3 by using the length LB of the bottom side.

$$P4x = LB/2$$

$$P4y = h = 2 \times Ac/LB \qquad \text{(Formula 3)}$$

Next, the area density calculation unit 111 generates a polygon by drawing segments connecting the start point and end point (C0 and C3) of each Bezier curve and the vertexes found in step S107 in order (step S108). For example, in the example of FIG. 10, a polygon is generated by connecting the points C0, V1, V2, and C3 in order. In the example of FIG. 11, a polygon is generated by connecting the points C0, V3, and C3 in order. In the example of FIG. 12, a polygon is generated by connecting the points C0, V4, and C3 in order.

The area density calculation unit 111 divides the generated polygon into triangles by a known method (step S109). The generated polygon need not be divided into triangles and may be divided by using trapezoids.

The area density calculation unit 111 generates a pixel map by calculating a coverage (area density) of a polygon in each pixel by using triangles obtained by dividing the polygon (step S110). This pixel map is used when the irradiation time calculation unit 112 calculates an irradiation amount of a beam with which each pixel is irradiated.

As described above, according to the present embodiment, a Bezier curve is divided to such a degree that an interval between vertexes does not become too small relative to a size of a section for which a coverage is to be found, a figure (a trapezoid or a triangle) having an area equivalent to a curve portion of a Bezier curve obtained after the division is generated, and a polygon is generated by using vertexes of this figure. Since a high-precision approximate polygon that preserves an area in a region equivalent to a section size while suppressing the number of vertexes can be generated, a pixel coverage can be calculated speedily and accurately.

Second Embodiment

In electron beam writing, multiple writing, in which a necessary irradiation amount is divided among plural writings (exposures), is sometimes performed. In this case, vertexes used to generate a polygon for calculation of an irradiation amount may differ from one writing (pass) to another.

Figure 5:
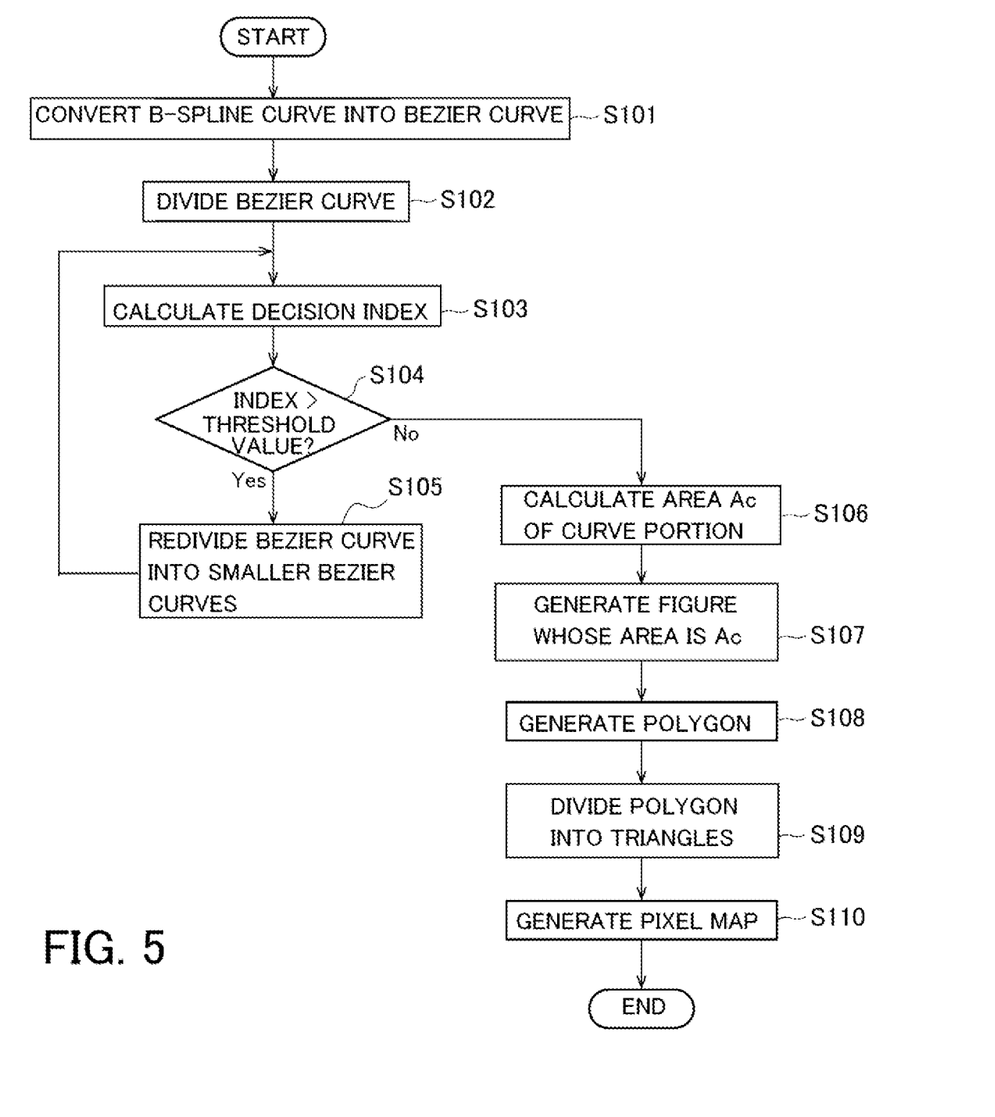
FIG. 5 is a flowchart for explaining a pixel map generation method.
Figure 6C:
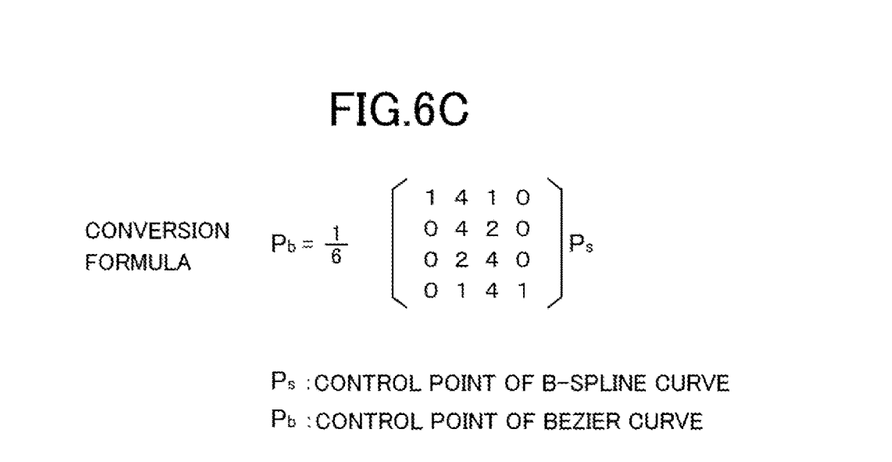
FIG. 6C illustrates a conversion formula.

First, a Bezier curve is divided so that an index becomes equal to or smaller than a predetermined threshold value by performing steps S101 to S105 of FIG. 5. For example, a Bezier curve K10 is redivided at an intermediate point into a Bezier curve K11 and a Bezier curve K12, as illustrated in FIGS. 8A and 8B. In a case where t=0 corresponds to control points C10 and C20 and t=1 corresponds to control points C13 and C26, t=0.5 is the intermediate point. The Bezier curve K11 is defined by control points C20, C21, C22, and C23. The Bezier curve K12 is defined by control points C23, C24, C25, and C26.

After the division of the Bezier curve, to calculate an irradiation amount in writing at a k-th pass (k is an integer of 1 or more), a k-th pixel map is generated by generating a polygon by drawing segments connecting t=0 (the control point C20), t=0.5/k, t=0.5+0.5/k, and t=1 (the control point C26) in order. An irradiation amount of a beam with which each pixel is to be irradiated is calculated by using the k-th pixel map.

Figure 13A:
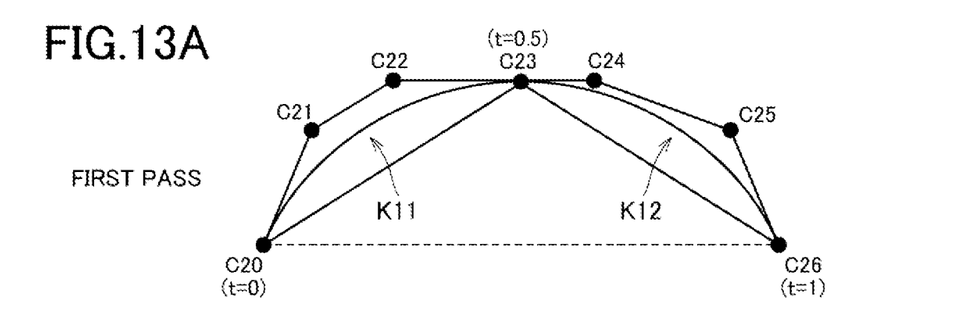
FIGS. 13A and 13B illustrate an example of generation of a polygon.

For example, in writing at the first pass (k=1), a first pixel map is generated by generating a polygon by drawing segments connecting the control points C20, C23, and C26, which are t=0, t=0.5, and t=1, in order, as illustrated in FIG. 13A. An irradiation amount of a beam with which each pixel is to be irradiated in writing at the first pass is calculated by using the first pixel map.

Figure 13B:
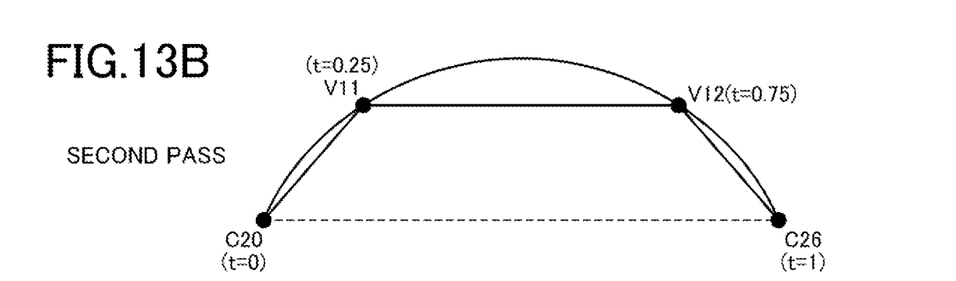

In writing at the second pass (k=2), a second pixel map is generated by generating a polygon by drawing segments connecting the control point C20, which is t=0, a point V11, which is t=0.25, a point V12, which is t=0.75, and the control point C26, which is t=1, in order, as illustrated in FIG. 13B. An irradiation amount of a beam with which each pixel is to be irradiated in writing at the second pass is calculated by using the second pixel map.

Figure 13C:
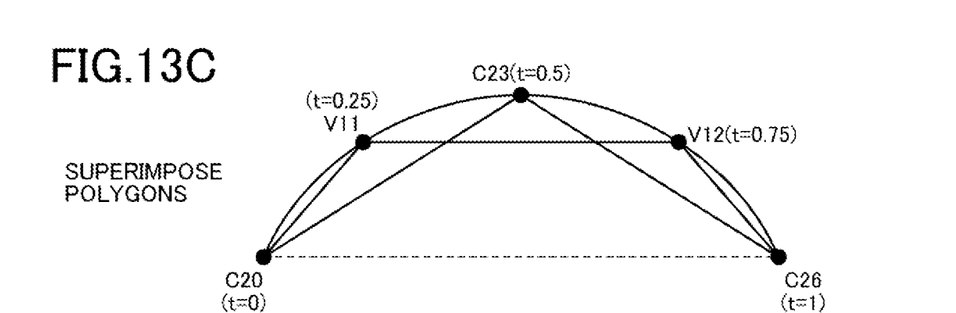
FIG. 13C illustrates superimposition of approximate polygons.

In multiple writing whose number of passes is 2, a polygon illustrated in FIG. 13C is obtained by superimposing the polygon at the first pass and the polygon at the second pass and has a shape approximate to the Bezier curve.

Figure 14A:
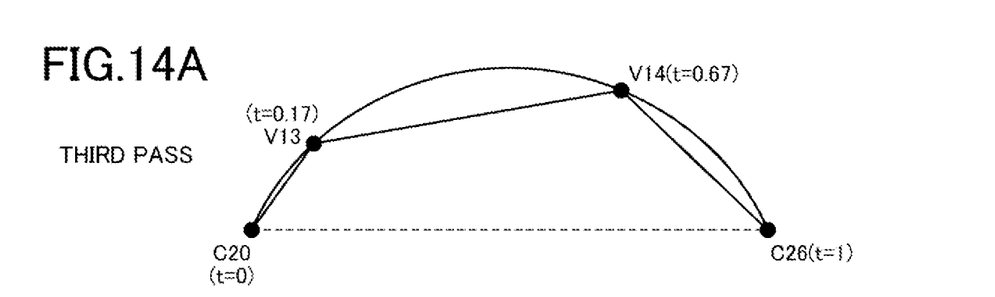
FIG. 14A illustrates an example of generation of a polygon.

In writing at the third pass (K=3), a third pixel map is generated by generating a polygon by drawing segments connecting the control point C20, which is t=0, a point V13, which is t=0.17, a point V14, which is t=0.67, and the control point C26, which is t=1, in order, as illustrated in FIG. 14A. An irradiation amount of a beam with which each pixel is to be irradiated in writing at the third pass is calculated by using the third pixel map.

Figure 14B:
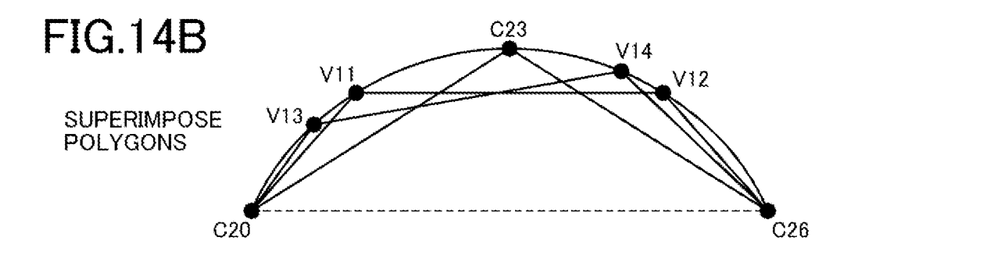
FIG. 14B illustrates superimposition of approximate polygons.

In multiple writing whose number of passes is 3, a polygon illustrated in FIG. 14B is obtained by superimposing the polygons at the first to third passes and has a shape more approximate to the Bezier curve.

As described above, a polygon is generated by using points that (at least partially) differ from one pass to another, and a pixel map is generated by using such a polygon. This can average errors of approximate polygons while keeping the number of vertexes small, thereby allowing speedy and accurate calculation of a pixel coverage.

A method for generating a polygon on an outer side of a Bezier curve by drawing segments connecting all control points of the Bezier curve in order and a method for generating a polygon on an inner side of the Bezier curve by drawing segments connecting only end points among control points of the Bezier curve may be combined.

Figure 15A:
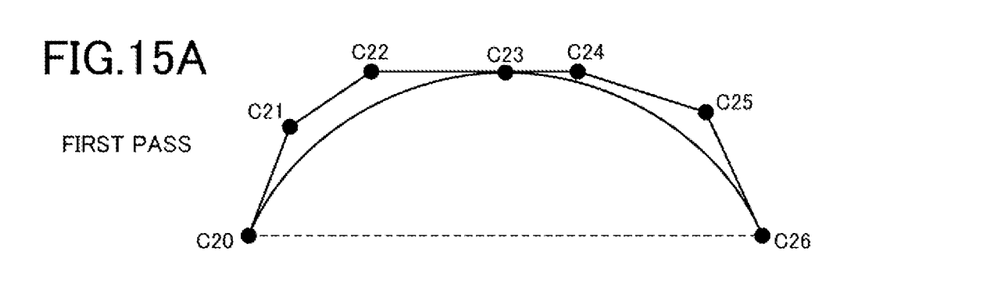
FIGS. 15A and 15B illustrate generation of a polygon.

For example, in writing at the first pass, a pixel map is generated by generating a polygon on an outer side of the curve by drawing segments connecting the control points C20 to C26 in order, as illustrated in FIG. 15A. An irradiation amount of a beam with which each pixel is to be irradiated in writing at the first pass is calculated by using this pixel map.

Figure 15B:
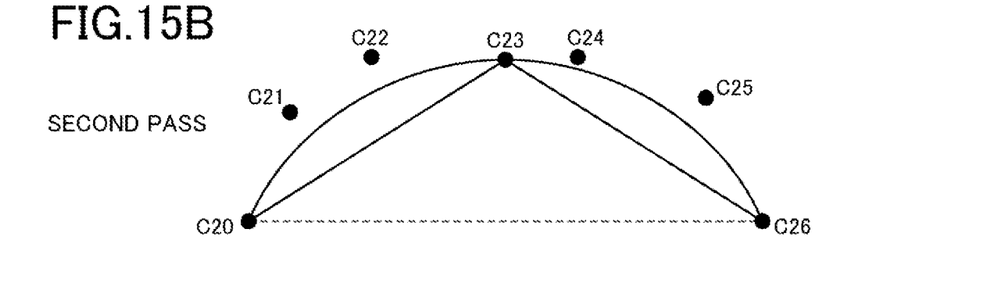

In writing at the second pass, a pixel map is generated by generating a polygon on an inner side of the curve by drawing segments connecting the control points C20, C23, and C26 in order, as illustrated in FIG. 15B. An irradiation amount of a beam with which each pixel is to be irradiated in writing at the second pass is calculated by using this pixel map.

By superimposing the approximate polygon illustrated in FIG. 15A and the approximate polygon illustrated in FIG. 15B, approximation errors are averaged, and a pixel coverage can be calculated precisely.

Furthermore, a polygon may be generated by drawing segments connecting end points among control points of each Bezier curve and any one of two direction points in order. A direction point used for generation of a polygon is changed for each pass of multiple writing.

Figure 16A:
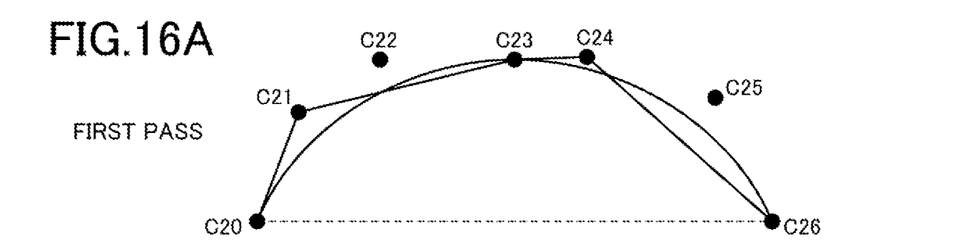
FIGS. 16A and 16B illustrate generation of a polygon.

For example, in writing at the first pass, a pixel map is generated by generating a polygon by drawing segments connecting the control points C20, C21, C23, C24, and C26 in order, as illustrated in FIG. 16A. An irradiation amount of a beam with which each pixel is to be irradiated in writing at the first pass is calculated by using this pixel map.

Figure 16B:
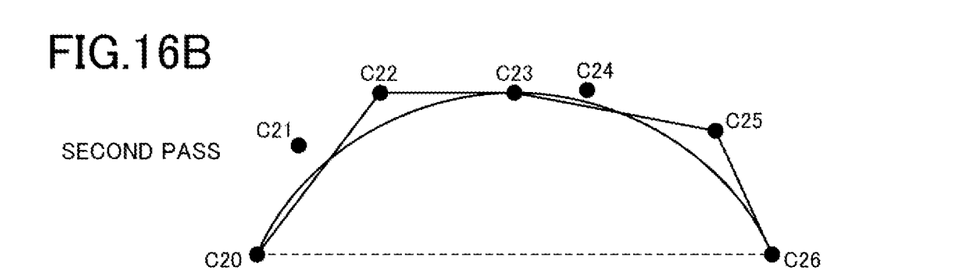

In writing at the second pass, a pixel map is generated by generating a polygon by drawing segments connecting the control points C20, C22, C23, C25, and C26 in order, as illustrated in FIG. 16B. An irradiation amount of a beam with which each pixel is to be irradiated in writing at the second pass is calculated by using this pixel map.

By superimposing the approximate polygon illustrated in FIG. 16A and the approximate polygon illustrated in FIG. 16B, approximation errors are averaged, and a pixel coverage can be calculated precisely.

Although a case where each polygon uses end points when polygons having different shapes for respective passes of multiple writing are generated has been described above, end points need not necessarily be used, and it is only necessary to generate polygons having different shapes by using control points that differ from one pass to another.

Although an example in which a curve of a figure pattern defined by a cubic B-spline curve is converted into a cubic Bezier curve has been described in the first and second embodiments, an order of a parametric curve is not limited to 3.

Although an example in which an input figure is expressed by a B-spline has been described in the first and second embodiments, a figure expressed by any of other parametric curves may be input data, as long as the figure can be converted into a Bezier curve.

The above processing may be performed by using a parametric curve other than a Bezier curve. The parametric curve is divided until an index becomes equal to or lower than a predetermined threshold value. After the division, vertexes of a figure (a trapezoid or a triangle) having an area equivalent to a curve portion of the parametric curve are found, and a polygon is generated by using the found vertexes. Alternatively, polygons are generated by using points that differ from one pass of multiple writing to another.

Although an example in which a figure (a trapezoid or a triangle) having an area equivalent to a curve portion of a parametric curve obtained after division is generated has been described in the above embodiments, a dose amount may be set equivalent to the original curve portion by combining an area of the generated figure and a dose modulation rate of the figure. For example, in a case where the area of the curve portion is 1.0, a figure having an area of 0.8 may be generated and a dose modulation rate of this figure may be set to 1.25.

Although a writing device that writes a pattern on a substrate has been described in the above embodiments, the present invention is also applicable to other irradiation devices such as an inspection device that irradiate a target object with a beam. Although a multi-beam irradiation device that radiate a lot of beams at one time by using multi-beams has been described in the above embodiments, a similar method is also applicable to a single-beam irradiation device that irradiates a target substrate with a single beam.

At least part of the control calculator 110 described in the above embodiments may be implemented in either hardware or software. When implemented in software, a program that realizes at least part of functions of the control calculator 110 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

The program that realizes at least part of the functions of the control calculator 110 may be distributed through a communication line (including wireless communications) such as the Internet. Further, the program may be encrypted, modulated, or compressed to be distributed through a wired line or wireless line such as the Internet or to be distributed by storing the program on a recording medium.

While certain embodiments have been described, these embodiments have been presented by way of example only, and are not intended to limit the scope of the inventions. For example, although the above embodiments employ the variable formation beam that is shaped at each shot and is irradiated, a beam having a definite shape may be irradiated. A plurality of beams can be irradiated simultaneously. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam irradiation method, comprising:
    dividing a parametric curve that defines a pattern shape into a plurality of parametric curves;
    calculating, for each of the plurality of parametric curves, an area of a region surrounded by a segment connecting end points among control points of the parametric curve and the parametric curve;
    calculating positions of vertexes of a figure having an area equivalent to the calculated area and having, as one side thereof, the segment connecting the end points;
    generating a polygon by using the vertexes;
    calculating a coverage of the polygon in each of a plurality of pixels obtained by dividing a target to be irradiated with a charged particle beam into predetermined sizes;
    calculating an irradiation amount of each of the plurality of pixels based on the calculated coverage; and
    controlling an irradiation unit to irradiate the charged particle beam onto the target with the calculated irradiation amount.

2. The method according to claim 1, wherein the parametric curve is a Bezier curve.

3. The method according to claim 2, wherein the figure is a trapezoid or a triangle having, as a bottom side thereof, the segment connecting the end points.

4. The method according to claim 2, wherein the Bezier curve is divided at a position of an inflection point.

5. The method according to claim 1, wherein the parametric curve is divided until a size of a bounding box that surrounds a figure having control points of the parametric curve as vertexes thereof becomes equal to or smaller than a predetermined value.

6. A charged particle beam irradiation device, comprising:
    an irradiation unit configured to irradiate a target with a charged particle beam; and
    control circuitry configured to divide a parametric curve that defines a pattern shape into a plurality of parametric curves, calculate, for each of the plurality of parametric curves, an area of a region surrounded by a segment connecting end points among control points of the parametric curve and the parametric curve, calculate positions of vertexes of a figure having an area equivalent to the calculated area and having, as one side thereof, the segment connecting the end points, generate a polygon by using the vertexes, calculate a coverage of the polygon in each of a plurality of pixels obtained by dividing a target to be irradiated with the charged particle beam into predetermined sizes, calculate an irradiation amount of each of the plurality of pixels based on the calculated coverage, and controlling the irradiation unit to emit the calculated irradiation amount.

7. The charged particle beam irradiation device according to claim 6, wherein the parametric curve divided by the control circuitry is a Bezier curve.

8. The charged particle beam irradiation device according to claim 7, wherein the figure, the vertices of which are calculated by the control circuitry, is a trapezoid or a triangle having, as a bottom side thereof, the segment connecting the end points.

9. The charged particle beam irradiation device according to claim 7, wherein the control circuitry is further configured to divide the Bezier curve at a position of an inflection point.

10. The charged particle beam irradiation device according to claim 6, wherein the control circuitry is further configured to divide the parametric curve until a size of a bounding box that surrounds a figure having control points of the parametric curve as vertexes thereof becomes equal to or smaller than a predetermined value.

11. A charged particle beam irradiation method, comprising:
    dividing a parametric curve that defines a pattern shape into a plurality of parametric curves;
    generating, for each pass of multiple writing of the charged particle beam, a polygon whose shape differs from one pass to another by using control points that differ from one pass to another among a plurality of control points corresponding to each of the plurality of parametric curves;
    calculating, for each pass, a coverage of the polygon in each of a plurality of pixels obtained by dividing a target to be irradiated with a charged particle beam into predetermined sizes;
    calculating an irradiation amount of each of the plurality of pixels based on the calculated coverage; and
    controlling an irradiation unit to irradiate the charged particle beam onto the target with the calculated irradiation amount.

12. The method according to claim 11, wherein the parametric curve is a Bezier curve.

13. The method according to claim 12, wherein a first polygon is generated on an outer side of the Bezier curve by drawing segments connecting all control points of the Bezier curve in order; and
    a second polygon is generated on an inner side of the Bezier curve by drawing segments connecting only end points among the control points of the Bezier curve in order.

14. The method according to claim 12, wherein the polygon is generated by using a direction point that differs from one pass to another among the plurality of control points.

15. The method according to claim 11, wherein the parametric curve is divided until a size of a bounding box that surrounds a figure having control points of the parametric curve as vertexes thereof becomes equal to or smaller than a predetermined value.

16. A charged particle beam irradiation device, comprising:

an irradiation unit configured to irradiate a target with a charged particle beam; and control circuitry configured to divide a parametric curve that defines a pattern shape into a plurality of parametric curves, generate, for each pass of multiple writing of the charged particle beam, the polygon whose shape differs from one pass to another by using at least one of a plurality of control points corresponding to each of the plurality of parametric curves, calculate, for each pass, a coverage of the polygon in each of a plurality of pixels obtained by dividing a target to be irradiated with the charged particle beam into predetermined sizes, calculate an irradiation amount of each of the plurality of pixels based on the calculated coverage, and control the irradiation unit to emit the calculated irradiation amount.

17. The charged particle beam irradiation device according to claim 16, wherein the parametric curve divided by the control circuitry is a Bezier curve.

18. The charged particle beam irradiation device according to claim 17, wherein the control circuitry is further configured to generate a first polygon on an outer side of the Bezier curve by drawing segments connecting all control points of the Bezier curve in order and generates a second polygon on an inner side of the Bezier curve by drawing segments connecting only end points among the control points of the Bezier curve in order.

19. The charged particle beam irradiation device according to claim 17, wherein the control circuitry is further configured to generate the polygon by using a direction point that differs from one pass to another among the plurality of control points.

20. The charged particle beam irradiation device according to claim 16, wherein the control circuitry is further configured to divide the parametric curve until a size of a bounding box that surrounds a figure having control points of the parametric curve as vertexes thereof becomes equal to or smaller than a predetermined value.

21. A non-transitory computer-readable recording medium storing a program causing a computer to execute a process for irradiating a charged particle beam onto a target, the process comprising:

dividing a parametric curve that defines a pattern shape into a plurality of parametric curves;

calculating, for each of the plurality of parametric curves, an area of a region surrounded by a segment connecting end points among control points of the parametric curve and the parametric curve;

calculating positions of vertexes of a figure having an area equivalent to the calculated area and having, as one side thereof, the segment connecting the end points;

generating a polygon by using the vertexes;

calculating a coverage of the polygon in each of a plurality of pixels obtained by dividing a target to be irradiated with the charged particle beam into predetermined sizes;

calculating an irradiation amount of each of the plurality of pixels based on the calculated coverage; and controlling an irradiation unit to irradiate the charged particle beam onto the target with the calculated irradiation amount.

22. A non-transitory computer-readable recording medium storing a program causing a computer to execute a process for irradiating a charged particle beam onto a target, the process comprising:

dividing a parametric curve that defines a pattern shape into a plurality of parametric curves;

generating, for each pass of multiple writing of the charged particle beam, a polygon whose shape differs from one pass to another by using control points that differ from one pass to another among a plurality of control points corresponding to each of the plurality of parametric curves;

calculating, for each pass, a coverage of the polygon in each of a plurality of pixels obtained by dividing a target to be irradiated with a charged particle beam into predetermined sizes;

calculating an irradiation amount of each of the plurality of pixels based on the calculated coverage; and controlling an irradiation unit to irradiate the charged particle beam onto the target with the calculated irradiation amount.

\* \* \* \* \*